United States Patent [19]

Yanagisawa et al.

[11] Patent Number: 5,270,965
[45] Date of Patent: Dec. 14, 1993

[54] METHOD OF DRIVING DEVICE HAVING METAL-INSULATOR-METAL(MIM)STRUCTURE

[75] Inventors: Yoshihiro Yanagisawa; Hisaaki Kawade, both of Atsugi; Kunihiro Sakai; Hiroshi Matsuda, both of Isehara; Haruki Kawada, Yokohama; Kiyoshi Takimoto; Yuko Morikawa, both of Kawasaki; Ken Eguchi, Yokohama, all of Japan

[73] Assignee: Canon Kabushiki Kaisha, Tokyo, Japan

[21] Appl. No.: 58,802

[22] Filed: May 10, 1993

Related U.S. Application Data

[63] Continuation of Ser. No. 873,613, Apr. 22, 1992, abandoned, which is a continuation of Ser. No. 666,479, Mar. 6, 1991, abandoned, which is a continuation of Ser. No. 328,564, Mar. 24, 1989, abandoned.

[30] Foreign Application Priority Data

Mar. 28, 1988 [JP] Japan .................. 63-71763

[51] Int. Cl.$^5$ .................. G11C 13/02; H01L 29/28
[52] U.S. Cl. .................. 365/107; 365/45; 365/106; 365/168; 257/40
[58] Field of Search .................. 365/45, 46, 94, 106, 365/107, 113, 163, 168; 257/1, 2, 4, 9, 40

[56] References Cited

U.S. PATENT DOCUMENTS

| | | | |
|---|---|---|---|
| 3,519,999 | 7/1970 | Gregor | 340/173 |
| 4,371,883 | 2/1983 | Potember et al. | 357/8 |
| 4,534,015 | 8/1985 | Wilson | 365/107 |
| 4,780,790 | 10/1988 | Takimoto et al. | 361/323 |
| 4,811,066 | 3/1989 | Pfiester et al. | 365/184 |
| 4,813,016 | 3/1989 | Okada et al. | 365/107 |

FOREIGN PATENT DOCUMENTS

| | | |
|---|---|---|
| 268370 | 5/1988 | European Pat. Off. |
| 62-42584 | 2/1987 | Japan |
| 62-95882 | 5/1987 | Japan |

OTHER PUBLICATIONS

*Applied Physics Letters*, vol. 37, No. 4, Aug. 1980, pp. 409-410, Singh, et al., "Electrical Behavior of Polyvinylchloride Thin Films".

*Electronics Letters*, vol. 21, No. 10, May 9, 1985, pp. 439-441, Fulop, et al., "Dielectric Switching With Memory in Thin Films of Stearic Acid".

*Thin Solid Films*, vol. 152, No. 1-2, Sep. 14, 1987, pp. 305-326, Sugi, "Molecular Engineering in Japan—Prospect of Research on Langmuir-Blodgett Films".

Primary Examiner—Alyssa H. Bowler
Assistant Examiner—Jack A. Lane
Attorney, Agent, or Firm—Fitzpatrick, Cella, Harper & Scinto

[57] ABSTRACT

A method of driving a device having a pair of electrodes and organic insulating layer sandwiched therebetween. The device exhibits at least three states of different electroconductivities in response to an applied voltage. A transition from the first state to the second state is achieved by applying a voltage within a first predetermined range to the device in the first state, and a transition from the second state to the third state is achieved by applying a voltage within a second predetermined range to the device in the second state.

55 Claims, 4 Drawing Sheets

METHOD OF DRIVING DEVICE HAVING METAL-INSULATOR-METAL(MIM)STRUCTURE

This application is a continuation of application Ser. No. 07/873,613 filed Apr. 22, 1992, now abandoned, which is a continuation of application Ser. No. 07/666,479 filed Mar. 6, 1991, now abandoned, which is a continuation of application Ser. No. 07/328,564 filed Mar. 24, 1989, now abandoned.

BACKGROUND OF THE INVENTION

1. Field of the Invention

This invention relates to a driving method which permits a device of Metal-Insulator-Metal (MIM) structure having an organic insulating layer to exhibit multi-value recordability.

2. Related Background Arts

In the prior art, concerning enlargement of capacity of memory device, in devices using an inorganic substance such as Si, etc., it has been investigated to make memory cells higher in density by contrivance of memory cell structure and constitution of the circuit, reduction in number of the constituent elements, etc. Also, as another means for effecting enlargement of capacity, there is multi-value recording by use of a CCD digital memory or a memory using the photochemical hole burning effect.

However, the devices using inorganic substances involve the problem that the substrate forming the device is limited, because the manufacturing process is complicated, and high temperature steps are included in the process. On the other hand, the memory using the photochemical hole burning effect requires extremely low temperature, resulting in the problem that great restrictions are incurred in practical application.

SUMMARY OF THE INVENTION

Accordingly, an object of the present invention, in view of the problems as mentioned above, is to provide a novel method of driving a device of MIM structure for exhibiting multi-value recordability without requiring a complicated preparation process or receiving great restrictions in practical application.

According to an aspect of the present invention, there is provided a method of driving a device having a MIM structure, which comprises applying sweeping voltages with two or more different ranges on a device of MIM structure having an organic insulating layer sandwiched between a pair of electrodes.

According to another aspect of the present invention, there is provided a method of driving a device having a MIM structure, which comprises applying sweeping voltages with two or more different ranges on a device of MIM structure having an organic insulating layer sandwiched between a pair of electrodes, thereby forming states with different electroconductivities on the device.

According to a further aspect of the present invention, there is provided a method of driving a device having a MIM structure, which comprises applying pulse voltages with two or more different voltages on a device of MIM structure having an organic insulating layer sandwiched between a pair of electrodes.

According to still another aspect of the present invention, there is provided a method of driving a device having a MIM structure, which comprises applying pulse voltages with two or more different voltages on a device of MIM structure having an organic insulating layer sandwiched between a pair of electrodes, thereby forming states with different electroconductivities on the device.

DETAILED DESCRIPTION OF THE PREFERRED EMBODIMENTS

Figure 1:
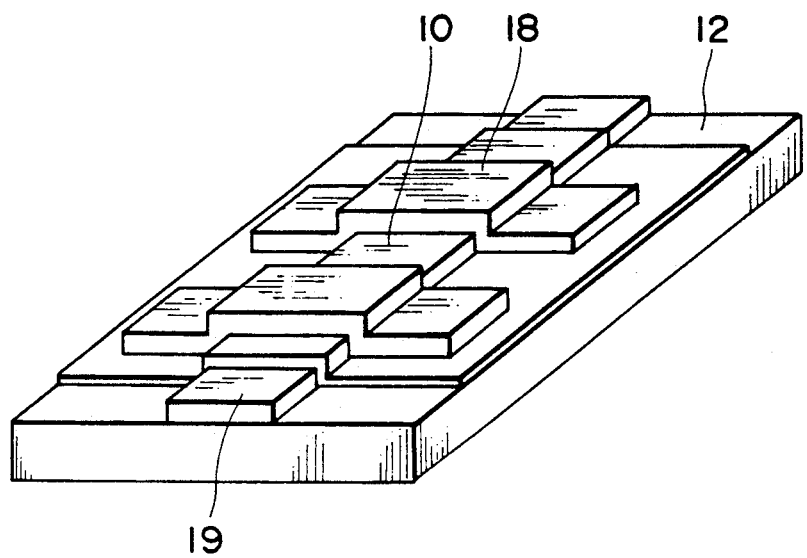
FIG. 1 a schematic illustration showing the constitution of a MIM device to be used in the present invention.

The present inventors, in order to solve the above task, were interested in the device of a metal-insulator-metal (MIM) structure having an organic insulating layer which can be prepared by a simple process, studied intensively about the electrical characteristics of said device, and consequently accomplished the present invention.

More specifically, in the present invention, there is contrived a means of applying sweeping voltages with two or more different ranges or pulse voltages with two or more different voltages on a device of MIM structure having an organic insulating layer sandwiched between a pair of electrodes. A sweeping voltage is the application of a variably scanning voltage, e.g., 0 V to 5 V to 0 V.

Generally speaking, almost all of organic materials exhibit insulating or semi-insulating property, and a remarkable diversity of organic materials is applicable for the organic insulating of the device of MIM structure to be used in the present invention.

As the structure of the dye having $\pi$-electron system suitable for the present invention, there may be included, for example, dyes having a porphyrine skeleton such as phthalocyanine, tetraphenylporphyrine, etc.; azulene type dyes having a squarilium group and croconic methine group as the bonding chain and cyanine-like dyes having two or more nitrogen-containing heterocyclic rings such as quinoline, benzothiazole, benzoxazole, etc., bonded through a squarilium group and croconic methine group; or cyanine dyes, condensed polycyclic aromatic compounds such as anthracene and pyrene, and chain compounds obtained by polymerization of aromatic ring and heterocyclic compounds; and polymers of diacetylene group; further derivatives of tetraquinodimethane or tetrathiafluvalene and analogues thereof and charge transfer complexes thereof; and further metal complex compounds such as ferrocene, tris-bipyridine ruthenium complexes, etc.

Also, preferable polymeric materials suitable as the material for the device of the present invention may include, for example, addition polymers such as polyacrylic acid derivatives, etc., condensed polymers such as polyimide, etc., ring-opened polymers such as nylon, etc., biological polymers such as bacteriorhodopsin, etc.

Concerning formation of an organic insulating layer, although the vapor deposition method or the cluster ion beam method may be applicable, an LB method is extremely suitable among the known techniques because of controllability, easiness and reproducibility.

According to the LB method, a monomolecular film of an organic compound having a hydrophobic site and a hydrophilic site in one molecule or a built-up film thereof can be formed easily on a substrate, which has a thickness on the molecular order and a uniform and homogeneous organic ultra-thin film can be supplied stably over a large area.

The LB method is a method in which a monomolecular film or its built-up film is prepared by utilizing the phenomenon that, in a molecule with a structure having a hydrophilic site and a hydrophobic site in a molecule, when the balance of the both (amphiphilic balance) is brought to a proper value, the molecule will form a layer of monomolecule on the water surface with the hydrophilic group directed downward.

Examples of the group constituting the hydrophobic site may include various hydrophobic groups generally known widely such as saturated and unsaturated hydrocarbon groups, condensed polycyclic aromatic groups and chain polycyclic phenyl groups, etc. These may constitute the hydrophobic moiety each individually or as a combination of a plurality thereof. On the other hand, most representative as the constituent of the hydrophilic moiety are, for example, hydrophilic groups such as carboxyl group, ester group, acid amide group, imide group, hydroxyl group, further amino groups (primary, secondary, tertiary, and quaternary), etc. These also constitute the hydrophilic moiety of the above molecule each individually or as a combination of a plurality thereof.

A dye molecule having these hydrophobic group and hydrophilic group in a well-balanced state and having a $\pi$-electron system having an appropriate size can form a monomolecular film on the water surface, and it can be an extremely suitable material for the present invention.

Specific examples may include the molecules as shown below.

[I] Croconic Methine Dyes

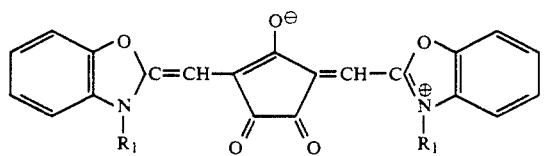

1)

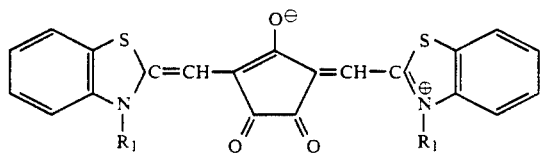

2)

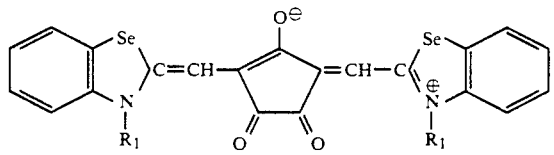

3)

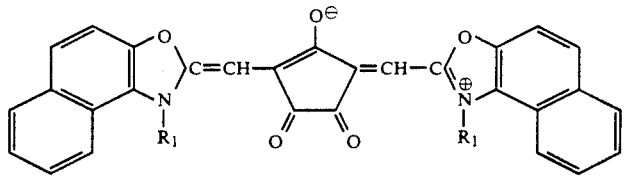

4)

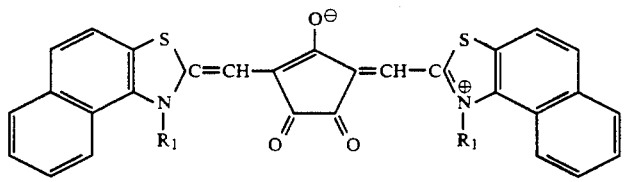

5)

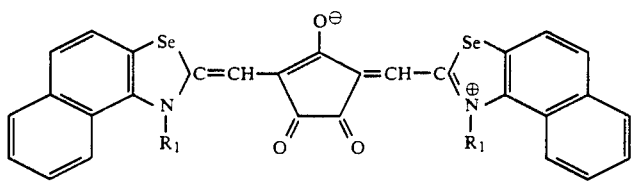

6)

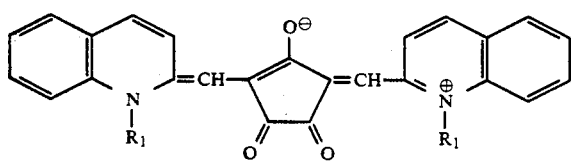
7)

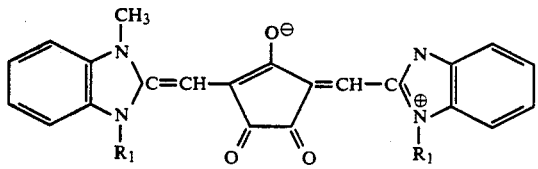
8)

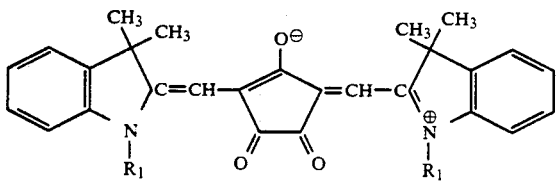
9)

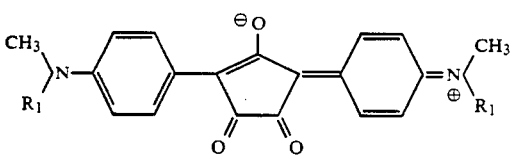
10)

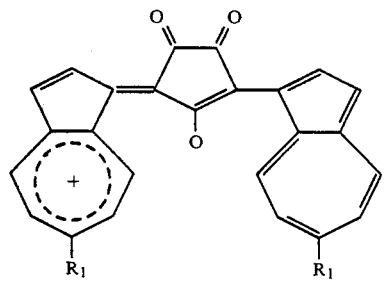
11)

wherein $R_1$ corresponds to the group having a π-electron level as mentioned above, and may be preferably a long chain alkyl group introduced with the carbon number n being ($5 \leqq n \leqq 30$) for making easier formation of the monomolecular film on the water surface. The compounds mentioned above as specific examples show only the basic structures, and various derivatives of these compounds are also suitable in the present invention, as a matter of course.

[II] Squarilium Dyes

Compounds mentioned in [I] in which the croconic methine groups are replaced with the squarilium group having the following structure:

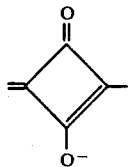

[III] Porphyrine Type Dye Compounds

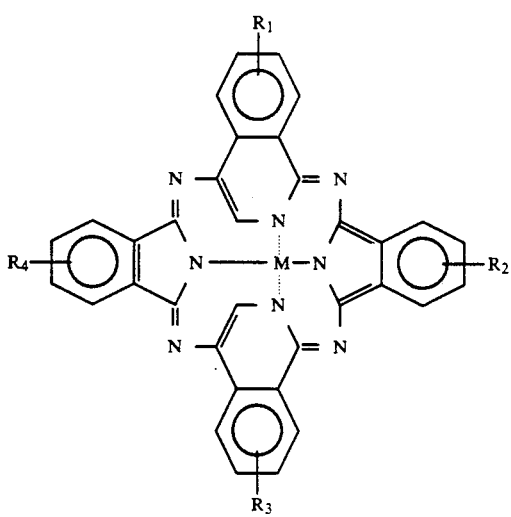
1)

-continued

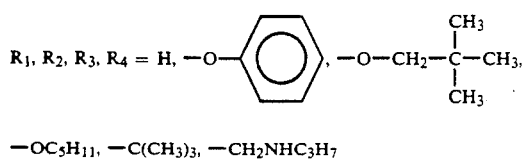

—OC$_5$H$_{11}$, —C(CH$_3$)$_3$, —CH$_2$NHC$_3$H$_7$

M = H$_2$, Cu, Ni, Al—Cl and rare earth metal ion

2)
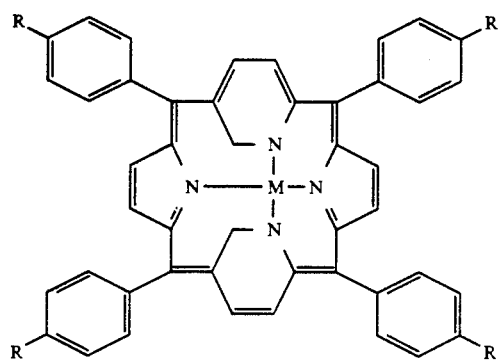

R = OCH(COOH)C$_n$H$_{2n+1}$  5 ≦ n ≦ 25
M = H$_2$, Cu, Ni, Zn, Al—C and rare earth metal ion 3)
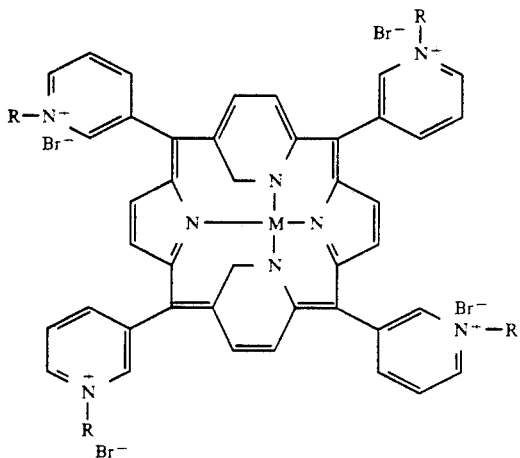

R = C$_2$H$_{2n+1}$  5 ≦ n ≦ 25
M = H$_2$, Cu, Ni, Zn, Al—Cl and rare earth metal ion R is introduced for making easier formation of the monomolecular film, and is not limited to the substituents mentioned here. On the other hand, R$_1$-R$_4$ correspond to the group having σ-electron level as mentioned above.

[IV] Condensed Polycyclic Aromatic Compounds

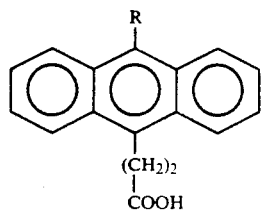

R = C$_4$H$_9$~C$_{12}$H$_{25}$

-continued

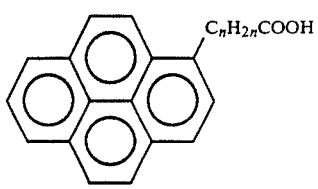

σ ≦ N ≦ 20

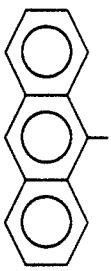

[V] Diacetylene Compounds

CH$_3$(CH$_2$)$_n$C≡C—C≡C(CH$_2$)$_m$X

0 ≦ n, m ≦ 20

(with the proviso that n+m>10)

X is a hydrophilic group, and generally —COOH is used, but —OH, —CONH$_2$, etc., can be also used.

[VI] Others

1)
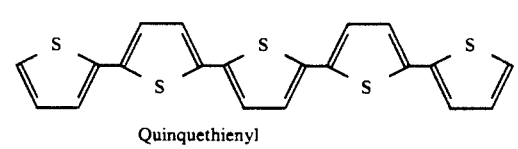
Quinquethienyl

2)
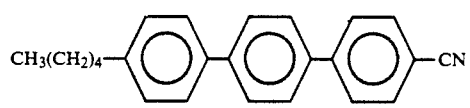

3)
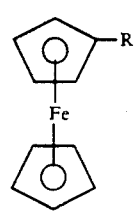

R = CONH$_{18}$H$_{37}$

-continued $$\begin{pmatrix} \phantom{O}\!\!-\!\!OCOC_{17}H_{35} \\ Fe \\ \phantom{O}\!\!-\!\!OCOC_{17}H_{35} \end{pmatrix}$$

$$\left[ H_{45}C_{22}\!-\!N\!\diagup\!\!\diagdown\!N \right]^{+}$$

$$\begin{pmatrix} NC \\ NC \end{pmatrix}\!=\!\diagup\!\!\diagdown\!\!=\!\!\begin{pmatrix} CN \\ CN \end{pmatrix}$$

$$NC\!\!-\!\!\overset{R}{\diagup\!\!\diagdown}\!\!-\!\!CN \qquad R = C_{18}H_{37}$$

[VII] Addition Polymerization Product

1) Polyacrylic acid $$\left( \!\!-\!CH\!-\!\underset{CO_2H}{\overset{R_1}{C}}\!\!-\! \right)_m$$

2) Polyacrylic ester $$\left( \!\!-\!CH\!-\!\underset{CO_2R_5}{\overset{R_1}{C}}\!\!-\! \right)_m$$

3) Acrylic acid copolymer $$\left( \!\!-\!CH\!-\!\underset{CO_2H}{\overset{R_1}{C}}\!\!-\!C\!\!-\!C\!\!-\! \right)_m$$

4) Acrylic ester copolymer $$\left( \!\!-\!CH\!-\!\underset{CO_2R_5}{\overset{R_1}{C}}\!\!-\!C\!\!-\!C\!\!-\! \right)_m$$

5) Polyvinyl acetate $$\left( \!\!-\!\underset{}{\overset{R_1}{CH}}\!\!-\!\underset{OCOCH_3}{CH}\!\!-\! \right)_m$$

6) Vinyl acetate copolymer

4)
$$\left( \!\!-\!\underset{}{\overset{R_1}{CH}}\!\!-\!\underset{OCOCH_3}{CH}\!\!-\!C\!\!-\!C\!\!-\! \right)_m$$

[VIII] Polycondensation Product

1) Polyimide

2) Polyamide

2) Polycarbonate $$\left( \!\!-\!OCO\!-\!\underset{}{\overset{R_1}{CH}}\!\!-\!CH_2\!\!-\! \right)_m$$

[IX] Ring-Opening Polymerization Product

1) Polyethylene oxide $$\left( \!\!-\!O\!-\!\underset{}{\overset{R_1}{CH}}\!\!-\!CH_2\!\!-\! \right)_m$$

Here, $R_1$ is a long chain alkyl group as described above. $R_2$ is a short chain alkyl group, having suitably a carbon number of $1 \leq n \leq 4$. The polymerization degree m may be suitably $100 \leq m \leq 5000$.

The compounds as mentioned above as specific examples are only basic structures, and various substitution products of these compounds are also suitable as the material for the device to be used in the present invention as a matter of course.

Dye materials suitable for the LB method other than those as mentioned above are of course suitable for the present invention. For example, biological materials of which the study is becoming popular (e.g., bacteriorhodopsin or cytochrome c) or synthetic polypeptides (PBLG, etc.) and others may be also applicable.

Such amphiphilic molecule forms a monomolecular film with the hydrophilic group directed downward. The monomolecular layer on the water surface has the characteristics of the two-dimensional system. When the molecules are scattered sparsely, the following formula of the two-dimensional ideal gas is valid between the area per one molecule A and the surface pressure:

$$\pi A = kT,$$

thus becoming "gas film". Here, k is Boltzmann's constant and T is an absolute temperature. When A is made sufficiently small, intermolecular interactions are strengthened, whereby the molecules become "condensed film (or solid film)" of a two-dimensional solid. The condensed film can be transferred, layer by layer, onto the surface of any desired body having various materials and shapes such as glass or resin. By use of this method, a monomolecular film or built-up films thereof can be prepared, and used as the organic insulating layer for the device.

As a specific preparation method, the following method may be employed.

Figure 4:
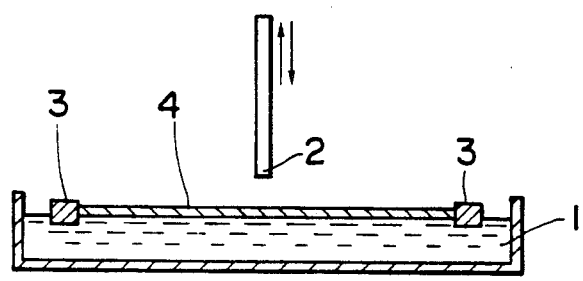
FIG. 4 is a schematic illustration of the method of forming an organic insulating layer of the device to be used in the present invention by the LB (Langmuir Blodgett) method.

A desired organic compound is dissolved in a solvent such as chloroform, benzene, acetonitrile, etc. Next, such solution is spread on an aqueous phase 1 by means of an appropriate device as shown in FIG. 4 in the accompanying drawings to form the organic compound in shape of a film.

Figure 5A:
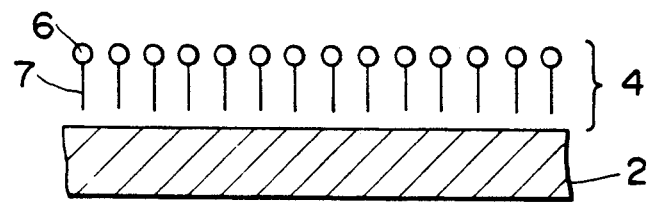
FIGS. 5A and 5B are schematic illustrations of monomolecular films.

Subsequently, a partitioning plate (or a float) 3 is provided to prevent too broad expansion of the spreading layer 4 through free diffusion on the aqueous phase 1, whereby the spreading area of the spreading film 4 is restricted to control the gathered state of the film substance and obtain a surface pressure $\pi$ in proportion to the gathered state. By moving this partitioning plate 3, the gathered state of the film substance can be controlled by reducing the spreading area, whereby the surface pressure can be gradually elevated to be set at a surface pressure suitable for preparation of the film. With the surface pressure kept constant, by moving vertically a clean substrate 2 gently, a monomolecular film of an organic compound is transferred onto the substrate 2. Such monomolecular film 4 is a film having molecules orderly arranged as shown in FIGS. 5A or 5B.

The monomolecular film 4 can be thus produced, and a built-up film with desired built-up number can be formed by repeating the above operation. For transfer of the monomolecular film 4 onto the substrate 2, other than the above vertical dipping method, such methods as the horizontal lifting method, the rotating cylinder method, etc., may be employed. The horizontal lifting method is a method in which transfer is effected with the substrate being contacted horizontally on the water surface, and the rotating cylinder method is a method in which the monomolecular layer is transferred onto the substrate surface by rotating a cylindrical substrate on the water surface.

Figure 5B:
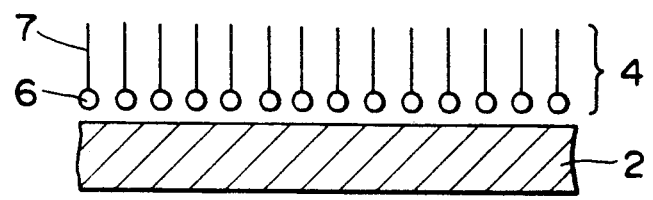
Figure 6A:
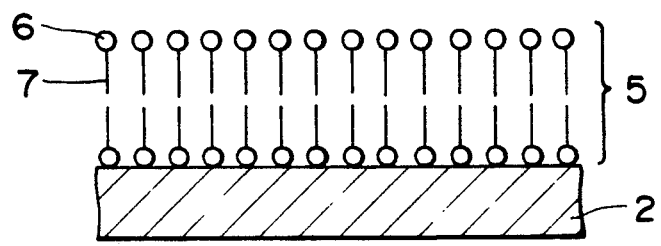
FIGS. 6A, 6B and 6C are schematic illustrations of built-up films.
Figure 6B:
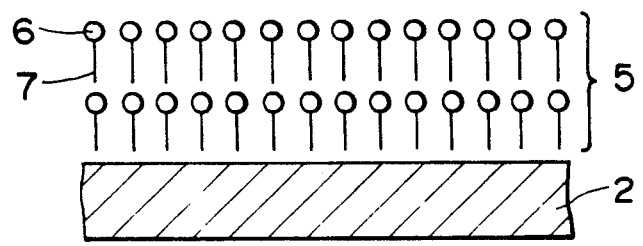
Figure 6C:
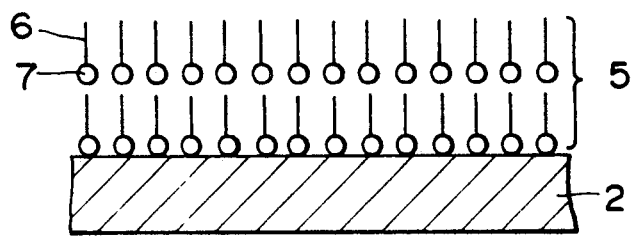

In the vertical dipping method as described above, when a substrate having a hydrophilic surface is withdrawn in the direction transversing the water surface, a monomolecular film 4 of the organic compound with the hydrophilic sites 6 of the organic compound directed toward the substrate 2 side is formed on the substrate 2 (FIG. 5B). When the substrate 2 is moved vertically, monomolecular films 4 are laminated one layer by one layer in the respective steps to form a built-up film 5 (FIG. 6A). Since the direction of the film forming molecules in the withdrawing step becomes opposite to that of the dipping step, there is formed a Y type film according to this method in which the hydrophobic sites 7 of the organic compound are faced to each other between the respective layers (FIG. 6A). In contrast, in the horizontal lifting method, the monomolecular film 5 is formed on the substrate 2 with the hydrophobic site 7 of the organic compound faced toward the substrate 2 side (FIG. 5A). According to this method, even when the monomolecular film 4 may be built up, there is no change in direction of the film forming molecules, but there is formed an X type film in which the hydrophobic sites 7 are faced toward the substrate side in all of the layers (FIG. 6B). On the contrary, a built-up film 5 in which the hydrophilic sites 6 are faced toward the substrate 2 side is called a Z type film (FIG. 6C).

The method for transferring the monomolecular film 4 onto a substrate 2 is not limited to the above methods, but it is also possible to employ a method in which a substrate is extruded into an aqueous phase from a roll, when employing a large area substrate. The direction of the hydrophilic groups and the hydrophobic groups toward the substrate as described above are given as a general rule, and it can also be modified by the surface treatment of the substrate, etc.

As described above, a potential barrier layer comprising the monomolecular film 4 of an organic compound or its built-up film is formed on the substrate 2.

In the present invention, the substrate 2 for supporting the thin film comprising a lamination of the organic material may be any of metal, glass, ceramics, plastic materials, etc., and further a biological material with remarkably lower heat resistance can also be used.

The substrate 2 as described above may be in any desired shape, preferably in a flat plate, which is not limitative of the present invention at all. This is because the above film forming method has such advantage that the film can be formed exactly in accordance with the shape of the substrate surface independently of the shape of the substrate surface.

Also, according to the LB method, the layer thickness of the organic insulating layer can be controlled freely on the molecular order, and in the present invention, memory characteristic can be exhibited readily in layers with layer thicknesses of 3 Å to 5000 Å, and those having layer thicknesses in the range from 10 Å to 1000 Å, particularly from 50 Å to 500 Å are preferred in memory characteristic. Also, when an organic insulating layer is formed by forming built-up films by the LB method, the number of the layers laminated should be preferably about 1 to 50. In the layer number, layer thickness as mentioned above, as the preferable resistance value in memory characteristic, several $\Omega$ or higher under high resistance state is desirable.

On the other hand, the electrode materials sandwiching such LB film therebetween may be those having high conductivity, as exemplified by a large number of materials, including metals such as Au, Pt, Ag, Pd, Al, In, Sn, Pb, etc., alloys thereof, further graphite, silicite, and further electroconductive oxides such as ITO, etc., and these materials may be considered to be applicable to the device in the present invention. Electrode formation using such materials may be sufficiently done by the thin film technique known in the art. Also, the electrode material to be formed directly on the substrate should be preferably formed by use of an electroconductive material which does not form an insulating oxide film during formation of LB film, such as a noble metal or an oxide electroconductive material such as ITO, etc.

In the present invention, sweeping voltages with two or more different ranges or pulse voltages with two or more different voltages are applied on the device of MIM structure as described above.

The voltage to be applied on the above device should be preferably between −30 V and 3 V, inclusive. On the other hand, pulse voltages capable of applying voltage for 10 nsec. to 1 sec., preferably 100 nsec. to 1 msec., are suitable.

In the present invention, by applying the above voltages, a nonlinear current voltage characteristic different from that obtained with the device of MIM structure known in the art can be exhibited. That is, three kinds or more of electroconductivities are exhibited to the different applied voltages, and the electroconductivities come to have memory characteristics.

EXAMPLE 1

As described below, a sample as shown in FIG. 1 was prepared. In FIG. 1, numeral 12 is a substrate, 19 a lower (subbing) electrode, 18 an upper electrode and 10 a monomolecular built-up film layer (LB film layer).

On a glass substrate (#7059, manufactured by Corning Co.) subjected to hydrophobicity treatment by leaving it to stand in saturated vapor of hexamethyldisilane (HMDS) overnight, Cr was deposited as the subbing layer to a thickness of 500 Å by the vacuum vapor deposition method, and further Au was deposited (film thickness 1000 Å) by the same method to form a subbing electrode shaped in stripes with a width of 1 mm. By use of such substrate as the carrier, monomolecular films of squarilium-bis-6-octylazulene (SOAZ) were built up according to the LB method. The built-up method is described below.

A chloroform solution of SOAZ dissolved at a concentration of 0.2 mg/ml was spread on an aqueous phase of water temperature of 20° C. with a $CdCl_2$ concentration of $5 \times 10^{-4}$ mol/liter adjusted to pH 6.7 with $KHCO_3$ to form a monomolecular film on the water surface. By waiting for removal by evaporation of the solvent, the surface pressure of such monomolecular film was enhanced to 20 mN/m, and further while maintaining constantly this pressure, the above substrate was dipped gently in the direction transversing the water surface at a speed of 10 mm/min., and then drawn up gently at 5 mm/min. to build up the Y-form monomolecular film of two layers. By repeating such operations for appropriate number, samples having 8 kinds of built-up films of 2, 4, 8, 12, 20, 30, 40 and 60 layers formed on the above substrate were prepared.

Next, an Al electrode (film thickness 1500 Å) shaped in stripes with a width of 1 mm was formed as an upper electrode by the vacuum vapor deposition on such film surface so that it may become perpendicular to the subbing electrode by maintaining the substrate at room temperature or lower.

Figure 2:
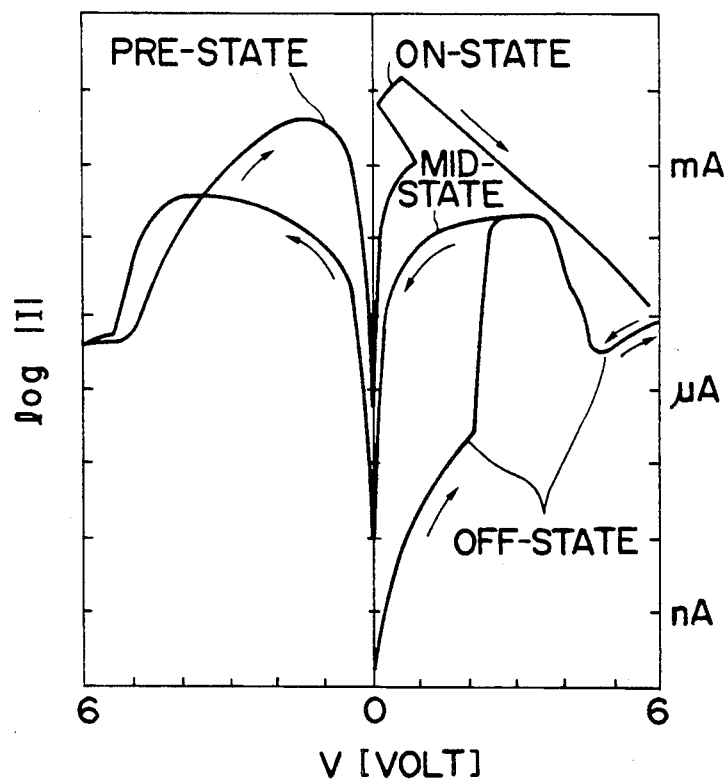
FIG. 2 is a characteristic graph showing the electrical characteristic (VI characteristic) obtained in such device.
Figure 3:
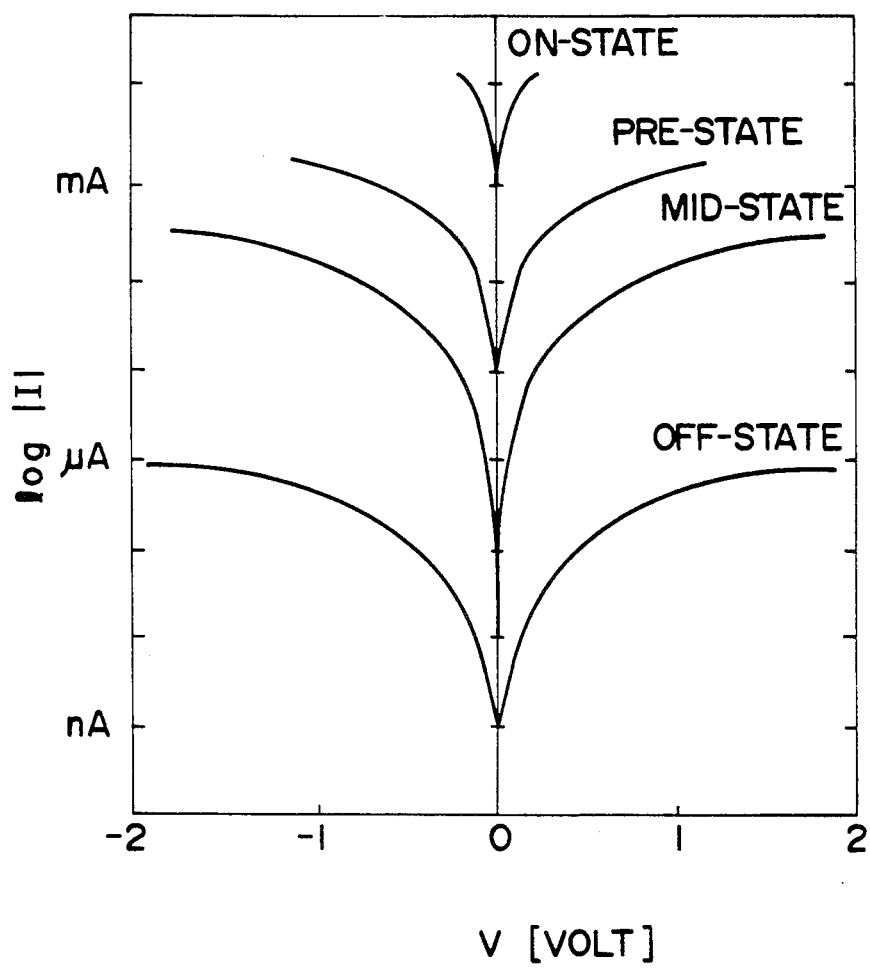
FIG. 3 shows the electrical characteristic graph of the ON-state, PRE-state, MID-state and OFF-state confirmed in such device.

When the current characteristic (VI characteristic) was measured when a voltage was applied between the upper and the lower electrodes of the sample prepared as described above, four kinds of states with different electroconductivities which have not been known in the art were observed (FIG. 2). Further, as shown in FIG. 3, the respective states of OFF-state (with resistance value of several MΩ to several tens of MΩ), PRE-state (with resistance value of 1 KΩ to several KΩ), ON-state (with resistance value of several tens of Ω), MID-state (with resistance value with several tens of KΩ to several hundreds of KΩ) could be prepared as desired by imparting specific electrical signals. Further, the respective states had memory characteristics.

As shown in FIG. 2, for making the sample in the MID-state, after application of a voltage of about 2 to 3 V on the sample in the OFF-state, the application voltage may be made 0 V. PRE-state can be prepared by returning gradually the applied voltage to 0 V after application of a negative voltage (about −7 to −10 V) on the sample in the MID-state. ON-state can be prepared by returning the applied voltage to 0 V after application of a voltage of about 1 to 2 V on the sample in the PRE-state. The OFF-state can be prepared by applying a voltage of a certain threshold value (1 to 2 V) or more on the sample in the ON-state.

Also, preparation of the MID-state, the PRE-state, the ON-state and OFF-state as described above is also possible by application of pulse voltage to a sample. Preparation of the MID-state was possible by application of a pulse voltage of 2 to 4 V to a sample in the OFF-state; preparation of the PRE-state by application of a pulse voltage of −3 to −4 V to a sample in the MID-state; preparation of the ON-state by application of a pulse voltage of 1 to 3 V to a sample in the PRE-state; and preparation of the OFF-state by application of a pulse voltage of a certain threshold value voltage (1–2 V) or higher in the ON-state. The pulse width at this time was 10 nsec to 1 sec. and when the pulse width is shorter than 10 nsec., preparation of each state was liable to become unstable, while when it is longer than 1 sec., damage was liable to occur to the device.

As described above, by contrivance of the voltage to be applied on the sample, it is possible to prepare states with four different electroconductivities, of the OFF-state, the MID-state, the PRE-state and the ON-state, and each state was nonvolatile and storage for a long term of at least 3 months was possible.

The thickness of each one SOAZ layer was about 15 Å as determined by the small angle X-ray diffraction method.

EXAMPLE 2

On a substrate subjected to the treatment of substrate and formation of subbing electrode according to the same method as in Example 1, a polyimide monomolecular film was formed by the method as described below.

A monomolecular film was formed on water surface by spreading a dimethylacetamide solution having a polyamic acid (molecular weight: about 200,000) dissolved therein at a concentration of $1 \times 10^{-3}$% (g/g) on the aqueous phase of pure water with a water temperature of 20° C. The surface pressure of the monomolecular film was enhanced to 25 mN/m, and further while maintaining this pressure constantly, the above substrate was dipped and drawn up by moving it in the direction transversing the water surface at 5 mm/min. to build up Y-form monomolecular films. By repeating such operations, 6 kinds of built-up films of 12, 18, 24, 30, 36 and 40 layers were prepared. Further, these films were heated at 300° C. for 10 minutes to form polyimides.

Next, on such film surface, Al was vapor deposited as the upper electrode in the same manner as described in Example 1.

As the result of measurement of VI characteristic for the samples prepared as described above in the same manner as in Example 1, similar results were obtained for all of the samples prepared. That is, it was observed that the respective states had memory characteristic, and also that switching between the respective states was possible by application of pulse voltage.

The thickness per one polyimide layer was determined to be about 3.6 Å by the ellipsometry method.

EXAMPLE 3

A substrate of ITO etched in stripes with 1 mm width by the method known in the art was subjected to the hydrophobicity treatment according to the method as shown in Example 1, and by use of the substrate thus treated as the carrier, monomolecular film of anthracene was built up according to the LB method.

As the aqueous phase, a $2.5 \times 10^{-4}$ M aqueous solution of $CdCl_2$ adjusted with dilute hydrochloric acid to pH=4.5 was used. On the aqueous phase liquid surface was spread C6 anthracene dissolved in chloroform to form a monomolecular film on the water surface. By waiting for removal by evaporation of the solvent, the surface pressure of such monomolecular film was enhanced to 15 mN/m, and further while maintaining the pressure constantly, the above substrate was dipped gently in the direction transversing the water surface at a speed of 2.5 mm/min. to form one layer of monomolecular film on the electrode substrate. Subsequently, by repeating dipping and draw-up gently so as to transverse the water surface at the same vertically moving speed of 2.5 mm/min., built-up films of 10 layers, 14 layers and 18 layers were formed on ITO. Next, a sample was prepared in the same manner as in Example 1 by forming an Au electrode (film thickness of 1000 Å) and Al electrode (film thickness 1500 Å) in stripes with a width of 1 mm on the film surface of so as to be crossed perpendicularly to the ITO electrode.

As the result of measurement of VI characteristic for the samples prepared as described above in the same manner as in Example 1, similar results were obtained for all the samples prepared. That is, it was observed that the respective states had memory characteristics, and also that switching between the respective states was possible by application of pulse voltage.

The thickness per one layer of C6 anthracene was determined by the small angle X-ray diffraction method to be about 13 Å.

EXAMPLES 4-6

By use of the electrode materials and insulating materials, and the layer numbers thereof as shown in Table 1, samples having device structure similar to that of Example 1 were prepared. Metal electrodes were formed by vacuum vapor deposition according to the resistance heating method.

When VI characteristics were measured similarly as in Examples 1, 2, 3, as shown in Table 1, concerning all of the samples, it was recognized that the respective states had memory characteristics, and also that switching between the respective states was possible by application of pulse voltage.

TABLE 1

| Example No. | Subbing electrode | Upper electrode | Insulating material (layer number) | LB film forming conditions | Pulse response of switching |
|---|---|---|---|---|---|
| 4 | Pt (100Å) | Au (1000Å) | SOAZ (20) | The same as in Example 1 | ○ |
| 5 | ITO (1000Å) | Al (1000Å) | Tetraphenylporphine derivative* (20) | The same as in Example 1 | ○ |
| 6 | Cr/Au (500Å/1000Å) | Al (1500Å) | Pentacosa-10,12-dinoic acid (20) | The same as in Example 1 | ○ |

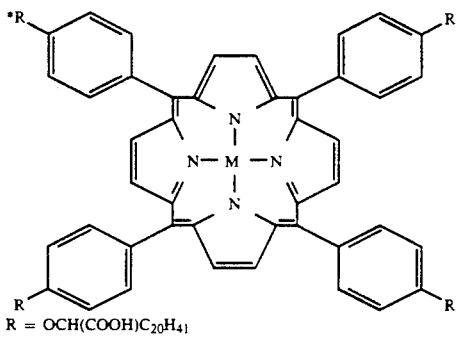

R = OCH(COOH)$C_{20}H_{41}$

In the Examples as described above, the LB method was employed for formation of organic insulating layers, but any film forming method capable of preparing a very thin, uniform, insulating organic thin film may be available without limitation to the LB method. Specifically, the vacuum vapor deposition method, the electrolytic polymerization method, the CVD method, etc., may be included, and the scope of available organic materials can be expanded.

As also already described concerning formation of electrodes, any film forming method capable of forming a uniform thin film on an organic thin film layer is available, and it is not limited to the vacuum vapor deposition method or the sputtering method.

Further, the substrate material and its shape are not limited at all in the present invention.

The present invention has the following effects.

(1) Since three or more kinds of states with different electroconductivities having memory characteristic can be obtained, three or more kinds of multi-value memory states can be realized with one device to enhance the recording density.

(2) Since a device having an organic insulating layer is used, the device used can be prepared easily. Particularly, by forming an insulating layer by building up monomolecular film, film thickness control on the molecular order (several Å to several tens of Å), can be easily realized. Also, because of a simple, room temperature process, controllability is excellent, reproducibility during formation of the device is high to be enriched in productivity, with the material of the substrate being not restricted.

(3) As compared with the case using a MIM device comprising only an inorganic material, the degree of freedom of the device constituting material employed is high, and utilization of a device having high affinity for living bodies such as molecular electronics, bioelectronics, etc., can be utilized in the future.

(4) Since switching can be effected by application of pulse voltage, the device of MIM structure can be used as the high switching memory device.

(5) Since storage of memory is possible without application of external power at room temperature, restriction in time of utilization is extremely small.

We claim:

1. A method of driving a device having a pair of electrodes and an organic layer sandwiched therebetween provided on a substrate, one electrode of the pair of electrodes near the substrate being formed of an electroconductive material which does not form an insulating oxide film, the organic layer having a thickness of 3 Å to 5000 Å and the device having at least three different resistance values, one of the at least three resistance values being exhibited when a voltage within a corresponding predetermined voltage range is applied between the pair of electrodes, each of the at least three resistance values of the device being kept unchanged until a voltage exceeding the corresponding predetermined voltage range is applied between the pair of electrodes to thereby change the resistance value of the device to another of the at least three resistance values, said method comprising the steps of:

applying a first voltage exceeding the corresponding predetermined voltage range between the pair of electrodes of the device under a first state of exhibiting a first resistance value of the at least three resistance values to bring the device into a second state of exhibiting a second resistance value of the at least three resistance values; and applying a second voltage exceeding the corresponding predetermined voltage range between the pair of electrodes of the device under the second state of exhibiting the second resistance value of the at least three resistance values to bring the device into a third state of exhibiting a third resistance value of the at least three resistance values.

2. A method according to claim 1, wherein the organic insulating layer comprises an organic compound having at least one $\pi$ electron system.

3. A method according to claim 1, wherein the organic insulating layer has a thickness in the range from 10 Å to 1000 Å.

4. A method according to claim 3, wherein the organic insulating layer comprises a Langmuir-Blodgett film.

5. A method according to claim 1, wherein sweeping voltage within the range of $-30$ V to $+30$ V is applied.

6. A method according to claim 1, wherein the electroconductivity becomes higher with the first and second transitions from the first state toward the third state.

7. A method according to claim 1, wherein each of the states has memory characteristics.

8. A method according to claim 1, wherein the second transition from the second state to the third state is achieved by applying a voltage which is polarized opposite to the voltage applied during the first transition from the first state to the second state.

9. A method of driving a device having a pair of electrodes and an organic layer sandwiched therebetween provided on a substrate, one electrode of the pair of electrodes near the substrate being formed of an electroconductive material which does not form an insulating oxide film, the organic layer having a thickness of 3 Å to 5000 Å and the device having four different resistance values, one of the four resistance values being exhibited when a voltage within a corresponding predetermined voltage range is applied between the pair of electrodes, each of the four resistance values of the device being kept unchanged until a voltage exceeding the corresponding predetermined voltage range is applied between the pair of electrodes to thereby change the resistance value of the device to another of the four resistance values, said method comprising the steps of:

applying a first voltage exceeding the corresponding predetermined voltage range between the pair of electrodes of the device under a first state of exhibiting a first resistance value of the four resistance values to bring the device into a second state of exhibiting a second resistance value of the four resistance values;

applying a second voltage exceeding the corresponding predetermined voltage range between the pair of electrodes of the device under the second state of exhibiting the second resistance value of the four resistance values to bring the device into a third state of exhibiting a third resistance value of the four resistance values; and applying a third voltage exceeding the corresponding predetermined voltage range between the pair of electrodes of the device under the thus state of exhibiting the third resistance value of the four resistance values to bring the device into a fourth state of exhibiting a fourth resistance value of the four resistance values.

10. A method according to claim 9, wherein the electroconductivity becomes higher with the first, second and third transitions from the first state toward the fourth state.

11. A method according to claim 9, wherein a fourth transition from the fourth state to the first state is achieved by applying a voltage within a fourth predetermined range to the device exhibiting the fourth state.

12. A method according to claim 9, wherein the organic layer comprises an organic compound having at least one $\pi$ electron system.

13. A method according to claim 9, wherein the organic layer has a thickness in the range from 10 Å to 1000 Å.

14. A method according to claim 13, wherein the organic layer comprises a Langmuir-Blodgett film.

15. A method according to claim 9, wherein a sweeping voltage within the range of $-30$ V to $+30$ V is applied.

16. A method according to claim 9, wherein each of the states has memory characteristics.

17. A method of claim 9, wherein the second transition from the second state to the third state is achieved by applying a voltage which is polarized opposite to the voltage applied during the first transition from the first state to the second state.

18. A method of driving a device having a pair of electrodes and an organic layer sandwiched therebetween provided on a substrate, one electrode of the pair of electrodes near the substrate being formed of an electroconductive material which does not form an insulating oxide film, the organic layer having a thickness of 3 Å to 5000 Å and the device having at least three different resistance values, one of the at least three resistance values being exhibited when a voltage pulse within a corresponding predetermined voltage range is applied between the pair of electrodes, each of the at least three resistance values of the device being kept unchanged until a voltage pulse exceeding the corresponding predetermined voltage range is applied between the pair of electrodes to thereby change the resistance value of the device to another of the at least three resistance values, said method comprising the steps of:

applying a first voltage pulse exceeding the corresponding predetermined voltage range between the pair of electrodes of the device under a first state of exhibiting a first resistance value of the at least three resistance values to bring the device into a second state of exhibiting a second resistance value of the at least three resistance values; and applying a second voltage pulse exceeding the corresponding predetermined voltage range between the pair of electrodes of the device under the second state of exhibiting the second resistance value of the at least three resistance values to bring the device into a third state of exhibiting a third resistance value of the at least three resistance values.

19. A method according to claim 18, wherein the organic layer comprises an organic compound having at least one $\pi$ electron system.

20. A method according to claim 18, wherein the organic layer has a thickness in the range from 10 Å to 1000 Å.

21. A method according to claim 20, wherein the organic insulating layer comprises a Langmuir-Blodgett film.

22. A method according to claim 18, wherein a sweeping voltage within the range of $-30$ V to $+30$ V is applied.

23. A method according to claim 18, wherein the electroconductivity becomes higher with the first and second transitions from the first state toward the third state.

24. A method according to claim 18, wherein each of the states has memory characteristics.

25. A method according to claim 18, wherein the pulse width is in the range of 10 nsec to 1 sec.

26. A method according to claim 18, wherein the second transition of the second state to the third state is achieved by applying a voltage pulse which is polarized opposite to the voltage pulse applied during the first transition from the first state to the second state.

27. A method of driving a device having a pair of electrodes and an organic layer sandwiched therebetween provided on a substrate, one electrode of the pair of electrodes near the substrate being formed of an electroconductive material which does not form an insulating oxide film, the organic layer having a thickness of 3 Å to 5000 Å and the device having four different resistance values, one of the four resistance values being exhibited when a voltage pulse within a corresponding predetermined voltage range is applied between the pair of electrodes, each of the four resistance values of the device being kept unchanged until a voltage pulse exceeding the corresponding predetermined voltage range is applied between the pair of electrodes to thereby change the resistance value of the device to another of the four resistance values, said method comprising the steps of:

applying a first voltage pulse exceeding the corresponding predetermined voltage range between the pair of electrodes of the device under a first state of exhibiting a first resistance value of the four resistance values to bring the device into a second state of exhibiting a second resistance value of the at least four resistance values;

applying a second voltage pulse exceeding the corresponding predetermined voltage range between the pair of electrodes of the device under the second state of exhibiting the second resistance value of the four resistance values to bring the device into a third state of exhibiting a third resistance value of the four resistance values; and applying a third voltage pulse exceeding the corresponding predetermined voltage range between the pair of electrodes of the device under the third state of exhibiting the third resistance value of the four resistance values to bring the device into a fourth state of exhibiting a fourth resistance value of the four resistance values.

28. A method according to claim 27, wherein the organic layer comprises an organic compound having at least one $\pi$ electron system.

29. A method according to claim 27, wherein the organic layer has a thickness in the range from 10 Å to 1000 Å.

30. A method according to claim 29, wherein the organic layer comprises a Langmuir-Blodgett film.

31. A method according to claim 27, wherein a sweeping voltage within the range of $-30$ V to $+30$ V is applied.

32. A method according to claim 27, wherein each of the states has memory characteristics.

33. A method according to claim 27, wherein the electroconductivity becomes higher with the first, second and third transitions from the first state toward the fourth state.

34. A method according to claim 27, wherein the second pulse width is in the range of 10 nsec to 1 sec.

35. A method according to claim 27, wherein the transition of the second state to the third state is achieved by applying a voltage pulse which is polarized opposite to the voltage pulse applied during the first transition from the first state to the second state.

36. A method according to claim 27, wherein a fourth transition of the fourth state to the first state is achieved by applying a voltage pulse within a fourth predetermined range to the device exhibiting the fourth state.

37. A method of driving a device having a pair of electrodes and an organic layer sandwiched therebetween provided on a substrate, one electrode of the pair of electrodes near the substrate being formed of a noble metal or an oxide electroconductive material, said organic layer comprising a monolayer or multilayer or an organic compound having a $\pi$ electron system and the device having at least three different resistance values, one of the at least three resistance values being exhibited when a voltage pulse within a corresponding predetermined voltage range is applied between the pair of electrodes, each of the at least three resistance values of the device being kept unchanged until a voltage pulse exceeding the corresponding predetermined voltage range is applied between the pair of electrodes to thereby change the resistance value of the device to another of the at least three resistance values, said method comprising the steps of:

applying a first voltage pulse exceeding the corresponding predetermined voltage range between the pair of electrodes of the device under a first state of exhibiting a first resistance value of the at least three resistance values to bring the device into a second state of exhibiting a second resistance value of the at least three resistance values; and applying a second voltage pulse exceeding the corresponding predetermined voltage range between the pair of electrodes of the device under the second state of exhibiting the second resistance value of the at least three resistance values to bring the device into a third state of exhibiting a third resistance value of the at least three resistance values.

38. A method according to claim 37, wherein the organic layer comprises an organic compound having at least one $\pi$ electron system.

39. A method according to claim 37, wherein the organic layer has a thickness in the range from 10 Å to 1000 Å.

40. A method according to claim 39, wherein the organic layer comprises a Langmuir-Blodgett film.

41. A method according to claim 37, wherein a sweeping voltage within the range of $-30$ V to $+30$ V is applied.

42. A method according to claim 37, wherein the electroconductivity becomes higher with the first and second transitions from the first state toward the third state.

43. A method according to claim 37, wherein each of the states has memory characteristics.

44. A method according to claim 37, wherein the pulse width is in the range of 10 nsec to 1 sec.

45. A method according to claim 37, wherein the second transition of the second state to the third state is achieved by applying a voltage pulse which is polarized opposite to the voltage pulse applied during the first transition from the first state to the second state.

46. A method of driving a device having a pair of electrodes and an organic layer sandwiched therebetween provided on a substrate, one electrode of the pair of electrodes near the substrate being formed of a noble metal or oxide electroconductive material, the organic layer comprising a monolayer or multilayer of an organic compound having a $\pi$ electron system and the device having four different resistance values, one of the four resistance values being exhibited when a voltage pulse within a corresponding predetermined voltage range is applied between the pair of electrodes, each of the four resistance values of the device being kept unchanged until a voltage pulse exceeding the corresponding predetermined voltage range is applied between the pair of electrodes to thereby change the resistance value of the device to another of the four resistance values, said method comprising the steps of:

applying a first voltage pulse exceeding the corresponding predetermined voltage range between the pair of electrodes of the device under a first state of exhibiting a first resistance value of the four resistance values to bring the device into a second state of exhibiting a second resistance value of the four resistance values;

applying a second voltage pulse exceeding the corresponding predetermined voltage range between the pair of electrodes of the device under the second state of exhibiting the second resistance value of the four resistance values to bring the device into a third state of exhibiting a third resistance value of the four resistance values; and applying a third voltage pulse exceeding the corresponding predetermined voltage range between the pair of electrodes of the device under the third state of exhibiting the third resistance value of the four resistance values to bring the device into a fourth state of exhibiting a fourth resistance value of the four resistance values.

47. A method according to claim 46, wherein the organic layer comprises an organic compound having at least one $\pi$ electron system.

48. A method according to claim 46, wherein the organic layer has a thickness in the range from 10 Å to 1000 Å.

49. A method according to claim 48, wherein the organic layer comprises a Langmuir-Blodgett film.

50. A method according to claim 46, wherein a sweeping voltage within the range of $-30$ V to $+30$ V is applied.

51. A method according to claim 46, wherein each of the states has memory characteristics.

52. A method according to claim 46, wherein the electroconductivity becomes higher with the first, second and third transitions from the first state toward the fourth state.

53. A method according to claim 46, wherein the pulse width is in the range of 10 nsec to 1 sec.

54. A method according to claim 46, wherein the second transition of the second state to the third state is achieved by applying a voltage pulse which is polarized opposite to the voltage pulse applied during the first transition from the first state to the second state.

55. A method according to claim 46, wherein a fourth transition of the fourth state to the first state is achieved by applying a voltage pulse within a fourth predetermined range to the device exhibiting the fourth state.

* * * * *

UNITED STATES PATENT AND TRADEMARK OFFICE
CERTIFICATE OF CORRECTION

PATENT NO. : 5,270,965
DATED : December 14, 1993
INVENTOR(S) : YOSHIHIRO YANAGISAWA ET AL.    Page 1 of 2

It is certified that error appears in the above-identified patent and that said Letters Patent is hereby corrected as shown below:

COLUMN 1

Line 18, "Arts" should read --Art--.

COLUMN 2

Line 18, "(Langmuir" should read --(Langmuir- --.
Line 61, "tetrathiafluvalene" should read --tetrathiafulvalene--.

COLUMN 5

Line 47, "n being" should read --n--.

COLUMN 8

Line 62, "R=$CONH_{18}H_{37}$" should read --R=$CONH_{18}H_{37}$,--
                                                $OCOC_{17}H_{35}$

COLUMN 13

Line 4, "3 V," should read --30 V,--.
Line 65, "with" (second occurrence) should read --of--.

COLUMN 14

Line 15, "a" should read --the--.

UNITED STATES PATENT AND TRADEMARK OFFICE
CERTIFICATE OF CORRECTION

PATENT NO. : 5,270,965
DATED : December 14, 1993
INVENTOR(S) : YOSHIHIRO YANAGISAWA ET AL.     Page 2 of 2

It is certified that error appears in the above-identified patent and that said Letters Patent is hereby corrected as shown below:

COLUMN 17

Line 50, "insulating" should be deleted.
Line 53, "insulating" should be deleted.
Line 56, "insulating" should be deleted.

COLUMN 18

Line 35, "thus" should read --third--.
Line 61, "of" should read --according to--.

Signed and Sealed this

Thirtieth Day of August, 1994

Attest:

BRUCE LEHMAN

Attesting Officer          Commissioner of Patents and Trademarks